(12) United States Patent
Keskinen

(10) Patent No.: US 10,587,238 B2
(45) Date of Patent: Mar. 10, 2020

(54) SOUND PROCESSING METHOD

(71) Applicant: Oeksound Oy, Helsinki (FI)

(72) Inventor: Olli Erik Keskinen, Helsinki (FI)

(73) Assignee: OEKSOUND OY, Helsinki (FI)

( * ) Notice: Subject to any disclaimer, the term of this patent is extended or adjusted under 35 U.S.C. 154(b) by 0 days.

(21) Appl. No.: 15/794,300

(22) Filed: Oct. 26, 2017

(65) Prior Publication Data

US 2019/0131951 A1 May 2, 2019

(51) Int. Cl.
*G06F 17/00* (2019.01)
*H03G 5/16* (2006.01)
*H03G 5/00* (2006.01)
*H03G 9/02* (2006.01)

(52) U.S. Cl.
CPC ............. *H03G 5/165* (2013.01); *H03G 5/005* (2013.01); *H03G 9/025* (2013.01)

(58) Field of Classification Search
CPC ... H04S 7/307; H04S 2420/07; G01R 23/167; G10L 21/0205; G10L 21/0364; H03G 3/32; H03G 5/005; H03G 9/025; H04R 2430/03; H04R 25/356
See application file for complete search history.

(56) References Cited

U.S. PATENT DOCUMENTS 6,138,093 A * 10/2000 Ekudden ................. G10L 19/26
704/205
2009/0316930 A1* 12/2009 Horbach ................. H04S 7/301
381/99

\* cited by examiner

*Primary Examiner* — Thomas H Maung
(74) *Attorney, Agent, or Firm* — Jacob Eisenberg

(57) ABSTRACT

The invention is related to sound processing methods, especially to digital sound processing methods. In an embodiment of the invention, the method includes at least the following steps: calculating the magnitude spectrum of a segment of the sound signal, processing of the calculated magnitude spectrum to produce an outline of the spectrum indicating the peaks of the calculated magnitude spectrum, processing said outline to adjust said peaks and surrounding frequency areas of the spectrum, applying a Hilbert transform to said processed outline for forming the complex spectrum of a minimum phase impulse response, and convolving said minimum phase impulse response with said segment of the sound signal for forming a processed output signal segment.

10 Claims, 3 Drawing Sheets

SOUND PROCESSING METHOD

BACKGROUND OF THE INVENTION

1. Field of the Invention

The invention is related to sound processing methods, especially to digital sound processing methods.

2. Description of Related Art

The sound esthetics of modern popular music includes playback of the musical piece at a high volume without discernable distortion. This is a result of observations from the 1950's, when it was observed that more loud songs were considered to sound better by the listeners, i.e. were more popular commercially.

The sound level or recording level of a musical piece is often referred to as loudness. The loudness is a subjective experience of a human of the loudness of the musical piece. Experienced loudness is dependent on bandwidth and frequency contents of the material. Loudness is typically measured using a equal-loudness contour, which indicates the loudness of a frequency as experienced by test persons.

The sound esthetics has changed alongside the tools due to technological development. Modern sound producing methods and possibilities have increased the loudness of recordings and enabled more exact processing of details. Nowadays, accurate control of spectrum and dynamics is expected of commercial recordings.

Several typical methods exist for controlling the peak frequencies in middle-to-upper frequency bands. The most commonly used tool for manipulating the spectrum of sound is the equalizer. The proportional amplitudes of different frequency bands can be adjusted using an equalizer (EQ). The equalizer is a linear process, i.e. independent of the volume (amplitude) of the sound. An equalizer does not take into account the dynamics of the sound material or changes in the same.

A popular form of equalizers used in mixing are parametrical equalizers, for which the user can define the middle frequency and magnitude of attenuation or amplification, as well as bandwidth. Cutting of excess sound using an equalizer is a useful way to control too strong frequencies in the sound signal. However, there is the problem of strength of attenuation in relation to the music material. An equalizer does not react to the level of the incoming sound signal, whereby attenuation of sibilant frequencies of a singer, in addition to removing too strong s-phonemes, affects the color and clarity of the singer's voice through the whole musical piece. On the other hand, imperfections of the sound material may be dependent on the frequencies in the sound material, i.e. then the musical piece changes note also the frequencies of the imperfections change, whereby several equalizer processing bands needs to be defined. Single equalizer bands affect the color of the sound signal also during those times that the imperfections are not present in the sound material.

Multiband compressors can be used for controlling the relative sound levels of two or more frequency bands. A multiband compressor can, however, be problematic in many situations. In order to create a suitably sharp borders for the frequency band, the band filter edges need to be steep, which may create artefacts when the filtered frequency bands are again added together. The addition of the bands is uneven near the band edge frequency due to phase and amplitude errors, and in addition the impulse response of the frequency band of the edge frequency can be lengthened.

A dynamic equalizer is a combination of an equalizer and a multiband compressor. A dynamic equalizer monitors the sound level at a desired frequency or in a desired frequency band. If the sound level exceeds a specified level, a parametric equalizer is used to attenuate or amplify a desired frequency band. This allows processing of spot frequencies that are present only intermittently. A typical dynamic equalizer however shares the problem of a parametric equalizer in that that the filtering process does not adapt to appearance of new problematic spot frequencies.

Different feedback or echo removal processes can also be used to attenuate excess resonancies. These are used specifically in sound amplification systems. Tools for removing of resonances and feedbacks have several different working principles. For example, echo removal techniques used in telecommunications aim to model the transfer function between the source signal and the desired output signal using an adaptive filter, and using that adaptive filter to process the source signal towards the desired result. This works in situations, where the properties of the desired target output signal are known. In recording applications such a filter is not applicable in the same way, since only the source signal is available. In order to form the output target signal, the output target signal needs to be created by modifying the source signal, which requires knowledge and understanding of the desired result, and deep analysis.

Removal of feedback is typically performed by analysing the source signal, looking for spot frequencies that may indicate existence of feedback, and attenuation of these spot frequencies using narrow stopband filters. The existence of feedback can be recognized for example by analysing of existence of harmonic signal components or by real-time attenuation of potential feedback frequencies and deduction of the existence of feedback frequencies from the results of such attenuation. Neither of these methods is applicable for attenuation of excess spot frequencies in mixing or mastering: undesirable frequencies often are part of harmonic frequencies in the source sound material, and the processor does not have a model of the desired output signal from which to make determinations of whether the attenuation of specific spot frequencies is desirable or not.

SUMMARY OF THE INVENTION

The invention provides a method for filtering an audio signal using a minimum phase response filter that adapts to the audio signal, thereby performing the desired filtering of signal features when and only to such extent that such features exist in the signal.

Generally, in many embodiments of the invention, the method calculates a magnitude spectrum for a segment of the audio signal, and performs spectral processing of the magnitude spectrum to pick the peaks of the original spectrum, and manipulate the peaks as desired to produce an outline of a magnitude spectrum indicating the desired manipulation at different frequencies. Then, the resulting outline is used in association with Hilbert transform to form a minimum phase impulse response for processing said segment of the audio signal. Finally, the minimum phase impulse response is convolved with said segment of the audio signal in order to produce an output signal segment.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE DRAWINGS

Various embodiments of the invention will be described in detail below, by way of example only, with reference to the accompanying drawings, of which

DETAILED DESCRIPTION OF SOME EMBODIMENTS

The following embodiments are exemplary. Although the specification may refer to "an", "one", or "some" embodiment(s), this does not necessarily mean that each such reference is to the same embodiment(s), or that the feature only applies to a single embodiment. Single features of different embodiments may be combined to provide further embodiments.

In the following, features of the invention will be described with a simple example of a signal processing method with which various embodiments of the invention may be implemented. Only elements relevant for illustrating the embodiments are described in detail. Details that are generally known to a person skilled in the art may not be specifically described herein.

Figure 1A:
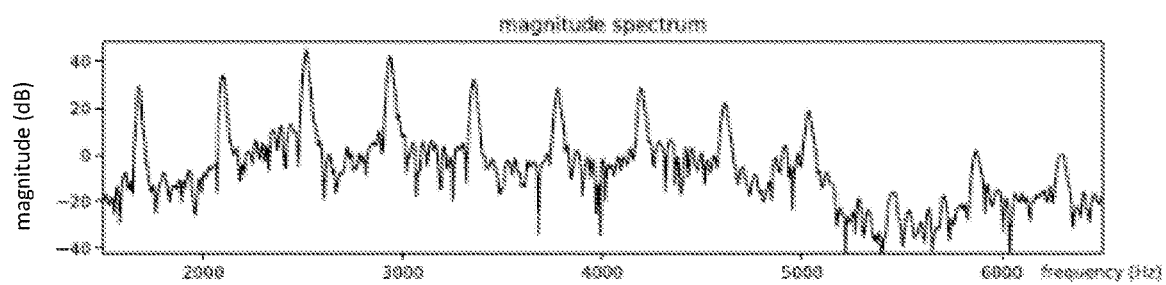
FIGS. 1A, 1B, 1C, 1D, and 1E illustrate how the various processing steps of the method effect the spectrum and/or the outline of the spectrum method according to an embodiment of the invention.
Figure 1B:
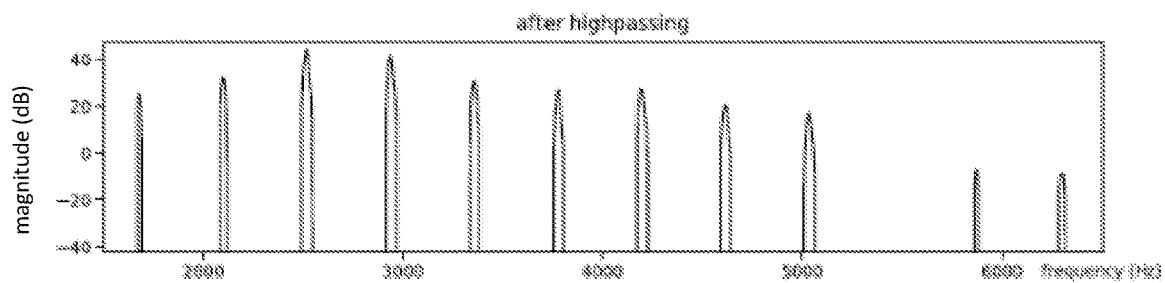
Figure 1C:
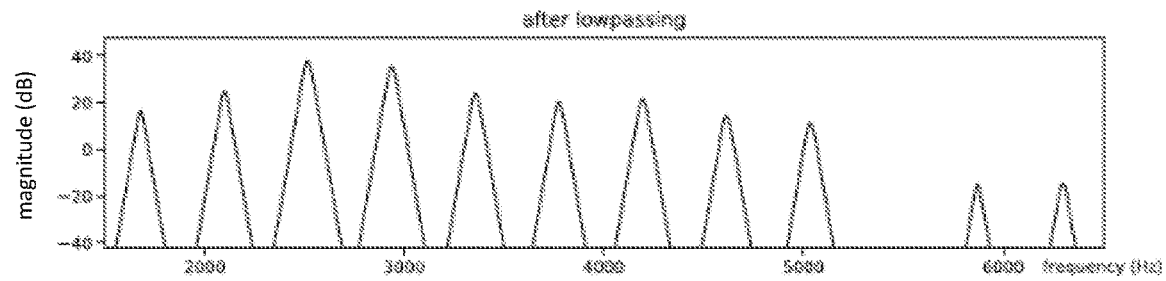

In the following, an embodiment of the invention is described with reference to FIGS. 1A to 1E. First, the input signal is cut into segments i.e. windowed with overlap, for example using a Hann window or similar. Then, for each segment (window) magnitude spectrum is calculated using a Fourier transform. FIG. 1A illustrates such a calculated magnitude spectrum. The resulting spectrum is then filtered using a highpass filter in order to remove the overall shape of the spectrum and leave behind only the peaks, as illustrated in FIG. 1B. Next, lowpass filtering is applied to the spectrum in order to smooth the peaks, as illustrated in FIG. 1C.

This has the advantage of reducing ringing of the desired filter response. In a further embodiment of the invention, the lowpass filtering is performed using a sweeping filter, i.e. a filter where the cutoff frequency changes for every bin of the spectrum. The spectrum can advantageously be further adjusted by applying per-bin weighting to compensate for lower bins typically having more energy in musical applications, and to emphasise or reduce peak reduction in desired areas. For example, a suitable per-bin weighting function is 1/sqrt(k), where k is the bin number. Other similar weighting functions can also be used in various embodiments of the invention.

Figure 1D:
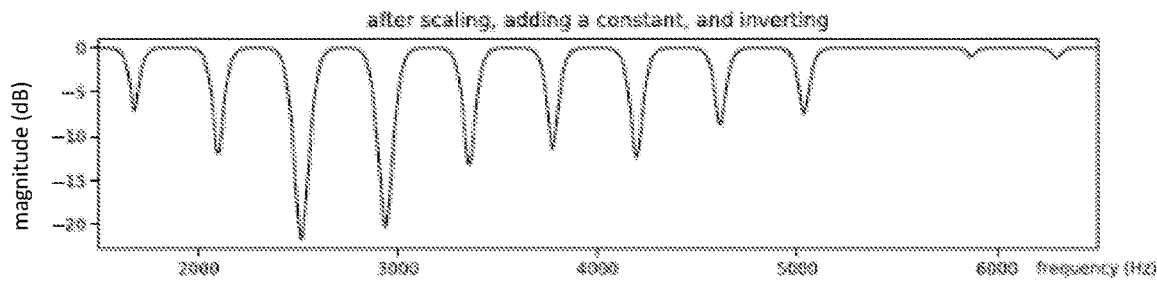
Figure 1:
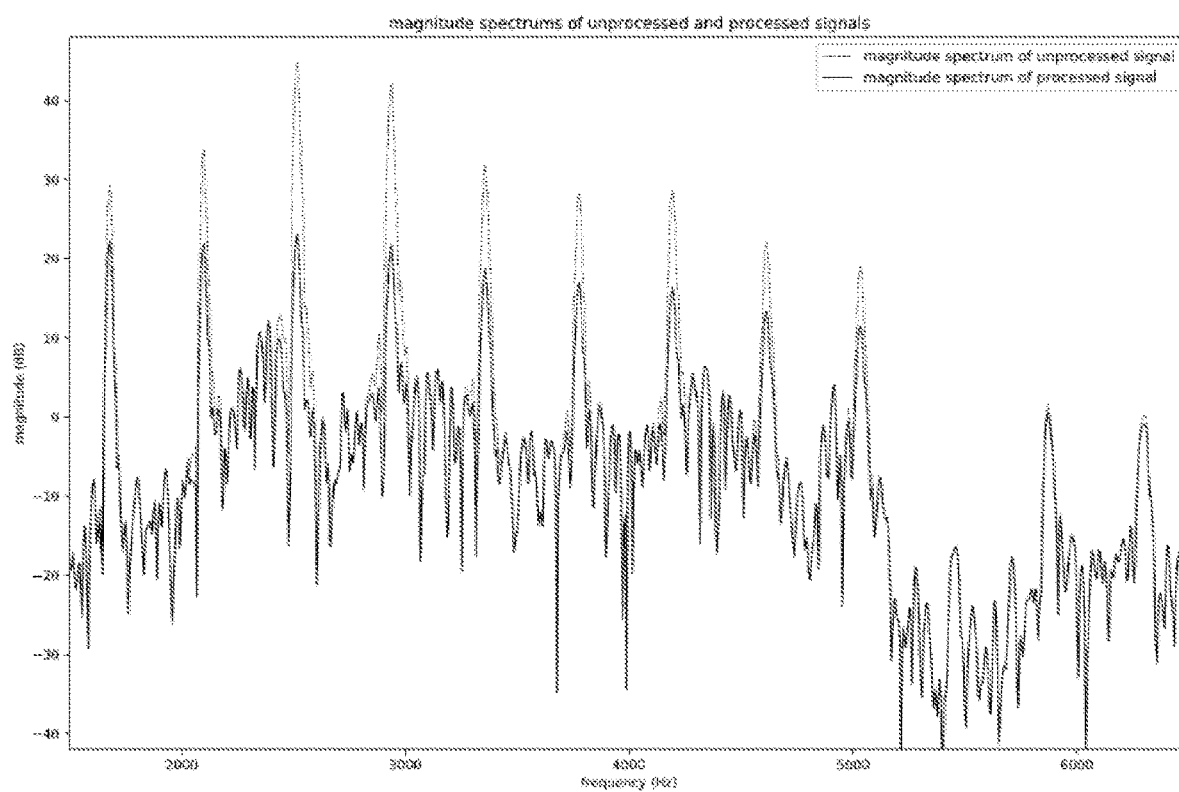

The processed spectrum can be processed further for example by linear or non-linear scaling in order to expand or limit the height of the outline of the spectrum. Further, the processed spectrum can also be inverted to produce a magnitude spectrum outline indicating frequencies to be enhanced or suppressed. FIG. 1D shows the result of scaling, adding a constant, and inverting of the outline of FIG. 1C.

Finally, Hilbert transform is applied to the resulting magnitude spectrum outline to form a minimum phase response. The minimum phase response is then convolved with the original signal segment (window) in order to produce a result signal segment. The convolution of the said segment of sound and formed minimum phase impulse response can be done as a multiplication of the spectrums, or for example in the time domain.

FIG. 1E illustrates the effect of the processing, showing the magnitude spectrum of the original unprocessed sound signal segment as a dotted line, and the magnitude spectrum of the final resulting sound signal segment as a continuous line. As can be seen from FIG. 1F, the spectrum peaks of the original sound signals have been attenuated, while the rest of the spectrum is nearly unchanged.

Figure 2:
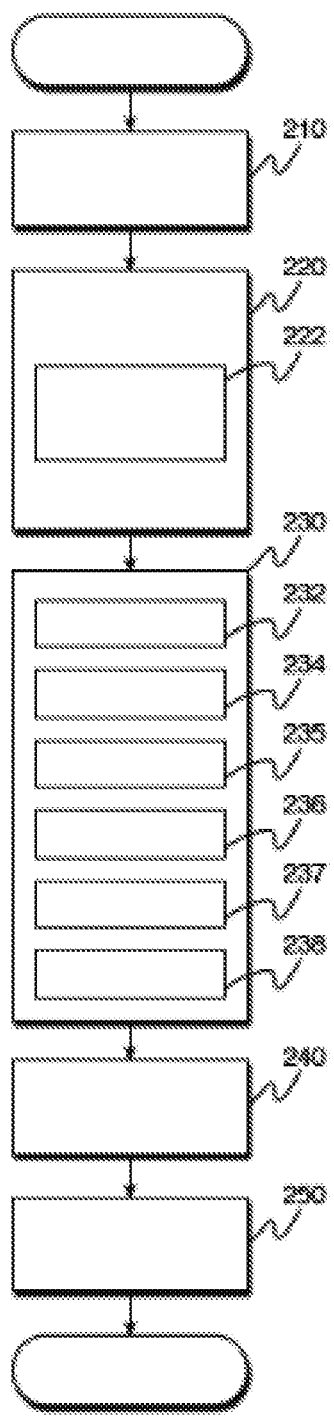
FIG. 2 illustrates the steps of a method according to an embodiment of the invention.

FIG. 2 illustrates further embodiments of the invention. This embodiment concerns processing of a sound signal, in which method the sound signal is processed in segments. In this embodiment at least the following steps are performed for a segment of the sound signal:

calculating 210 the magnitude spectrum of said segment of the sound signal, processing 220 of the calculated magnitude spectrum to produce an outline of the spectrum indicating the peaks of the calculated magnitude spectrum, processing 230 said outline to adjust said peaks and surrounding frequency areas of the spectrum, applying 240 a Hilbert transform to said processed outline for forming the complex spectrum of a minimum phase impulse response, and convolving 250 said minimum phase impulse response with said segment of the sound signal for forming a processed output signal segment.

In a further embodiment of the invention said step of processing 220 of the calculated magnitude spectrum comprises the step of applying highpass filtering 222 in order to remove the overall shape of the spectrum and retain the peaks of the spectrum.

In a further embodiment of the invention said step of processing 230 said outline to adjust said peaks of the spectrum comprises the step of applying lowpass filtering 232 to smooth the retained peaks.

In a further embodiment of the invention, said lowpass filtering is performed using a sweeping filter.

In a further embodiment of the invention said step of processing 230 said outline to adjust said peaks of the spectrum further comprises applying 234 a bin dependent weighting function to said outline.

In a further embodiment of the invention said step of processing 230 said outline to adjust said peaks of the spectrum further comprises the steps of scaling 235 the outline, and inverting 236 the outline. The scaling may be linear or non-linear scaling, such as for example exponential scaling with the scaling exponent being less than 1.

In further embodiments of the invention said step of processing 230 said outline to adjust said peaks of the spectrum further comprises the steps of adding 237 a constant to the outline and/or clipping 238 the outline to a specified range.

The order of steps 220 to 238 in FIG. 2 is only an example. In different embodiments of the invention the order of these steps may be different.

In a further embodiment of the invention, the inventive functionality is provided in a non-transitory computer-readable medium having stored thereon computer-readable instructions, wherein executing the instructions by a computing device causes the computing device to perform the inventive functionality described in this specification.

According to a further group of embodiments of the invention, a non-transitory computer-readable medium is provided. The non-transitory computer-readable medium has stored thereon computer readable instructions for carrying out a method for processing a sound signal, in which method the sound signal is processed in segments, wherein said computer readable instructions cause a processor of a device when executed by said processor to perform at least the following steps for a segment of the sound signal:

calculating the magnitude spectrum of said segment of the sound signal, processing of the calculated magnitude spectrum to produce an outline of the spectrum indicating the peaks of the calculated magnitude spectrum, processing said outline to adjust said peaks and surrounding frequency areas of the spectrum applying a Hilbert transform to said processed outline for forming the complex spectrum of a minimum phase impulse response, and convolving said minimum phase impulse response with said segment of the sound signal for forming a processed output signal segment.

In a further embodiment of this group of embodiments, said step of processing of the calculated magnitude spectrum comprises the step of applying highpass filtering in order to remove the overall shape of the spectrum and retain the peaks of the spectrum.

In a further embodiment of this group of embodiments, said step of processing said outline to adjust said peaks of the spectrum comprises the step of applying lowpass filtering to smooth the retained peaks.

In a further embodiment of this group of embodiments, said lowpass filtering is performed using a sweeping filter.

In a further embodiment of this group of embodiments, said step of processing said outline to adjust said peaks of the spectrum further comprises applying a bin dependent weighting function to said outline.

In a further embodiment of this group of embodiments, said step of processing said outline to adjust said peaks of the spectrum further comprises the steps of scaling the outline, and inverting the outline.

Different embodiments of the invention can be implemented as a software program product to be executed by a general purpose computing device, or by a digital signal processor (DSP) unit. The software program product can be in the form of an application software system that is downloadable from a server system; an application software system that is recorded on a computer-readable medium; as a software programming library for inclusion in other software product; or for example as a plugin software module for use by other software applications.

The invention has many benefits.

The invention allows control and dampening of strong spectral spikes, and in a dynamic fashion, matching the dampening to the incoming program material i.e. sound signal. The invention can advantageously be used for sound processing in music studios, sound post-processing, and sound reproduction systems.

The invention also has the advantage that due to the dynamically adjusting nature of processing, various embodiments of the invention do not apply processing when no peaks are present in the incoming audio signal, so that e.g. noise comes through relatively unprocessed as compared to processing using conventional static or dynamic equalizers or multiband compressors.

Further, in embodiments implementing non-linear scaling of the spectrum outline results in compressed dynamic response where increasing peak intensity in the input signal does not result in as much reduction as there is increase, and inversely, small input signal peaks are reduced more easily even when large peaks are present in the input signal.

A further benefit is that the resulting minimum phase filter response forces filtering artefacts down-stream, eliminating pre-ringing that conventional sharp linear phase equalizer cuts would have as a result.

A further benefit is that the filtering method can be performed on-the-fly, whereby the method can be used in studio and live environments.

A further benefit is that the method allows for flexible parametrisation with small number of parameters, such as the highpass and lowpass cutoff frequencies. Also, per-frequency bin weighting of the spectrum outline allows limiting the processing to just the frequency areas where needed.

The embodiments of the invention in which non-linear scaling of the spectrum outline in order to attenuate spectrum peaks result in higher peaks being attenuated more strongly than lower peaks, which fits equal loudness contours of the human hearing. This results in a naturally clear, pleasing filtering result for the listener.

Further, the forming of the spectrum outline is phase agnostic, i.e. phase information of the original spectrum can be discarded, because the necessary information is recreated with the Hilbert transform. This provides a flexible framework allowing arbitrary manipulation of the frequency balance.

In view of the foregoing description it will be evident to a person skilled in the art that various modifications may be made within the scope of the invention. While a preferred embodiment of the invention has been described in detail, it should be apparent that many modifications and variations thereto are possible, all of which fall within the true spirit and scope of the invention.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the following description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the foregoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The invention claimed is:

1. A method for filtering an audio signal using a minimum phase response filter that adapts to the audio signal thereby performing a desired filtering of signal features that exist in the signal, said method comprising processing the sound signal in segments, and wherein at least the following computer implemented steps are performed:

cutting said sound signal into overlapping segments, and performing at least the following computer implemented steps for each said segment of said sound signal:

calculating the magnitude spectrum of said segment of the sound signal, processing of the calculated magnitude spectrum to produce an outline of the spectrum indicating the peaks of the calculated magnitude spectrum, said step of processing of the calculated magnitude spectrum further including the step of applying high pass filtering in order to remove an overall shape of the spectrum and retain the peaks of the spectrum, processing said outline to adjust said peaks and surrounding frequency areas of the spectrum, executing a Hilbert transform to said processed outline to form a complex spectrum of a minimum phase impulse response, and convolving said minimum phase impulse response with said segment of the sound signal for forming a processed output signal segment.

2. The method according to claim 1, wherein
said step of processing said outline to adjust said peaks of the spectrum further includes a step of applying lowpass filtering to smooth the retained peaks.

3. The method according to claim 2, wherein said lowpass filtering is performed using a sweeping filter.

4. The method according to claim 2, wherein
said step of processing said outline to adjust said peaks of the spectrum further comprises applying a bin dependent weighting function to said outline.

5. The method according to claim 1, wherein
said step of processing said outline to adjust said peaks of the spectrum further comprises the steps of scaling the outline and inverting the outline.

6. A non-transitory computer-readable medium having stored thereon computer readable instructions for carrying out a method for processing a sound signal, in which method the sound signal is processed in segments, wherein said computer readable instructions comprise instructions to cause a processor of a device, when executed by said processor to perform at least the following steps:

cutting said sound signal into overlapping segments, and performing at least the following steps for each said segment of said sound signal:

calculating a magnitude spectrum of said segment of the sound signal, processing of the calculated magnitude spectrum to produce an outline of the spectrum indicating the peaks of the calculated magnitude spectrum, said step of processing of the calculated magnitude spectrum including the step of applying high pass filtering in order to remove an overall shape of the spectrum and retain the peaks of the spectrum, processing said outline to adjust said peaks and surrounding frequency areas of the spectrum, applying a Hilbert transform to said processed outline for forming a complex spectrum of a minimum phase impulse response, and convolving said minimum phase impulse response with said segment of the sound signal for forming a processed output signal segment.

7. The non-transitory computer-readable medium according to claim 6, wherein said step of processing said outline to adjust said peaks of the spectrum includes the step of applying lowpass filtering to smooth the retained peaks.

8. The non-transitory computer-readable medium according to claim 7, wherein said lowpass filtering is performed using a sweeping filter.

9. The non-transitory computer-readable medium according to claim 6, wherein said step of processing said outline to adjust said peaks of the spectrum further comprises applying a bin dependent weighting function to said outline.

10. The non-transitory computer-readable medium according to claim 6, wherein said step of processing said outline to adjust said peaks of the spectrum further comprises the steps of scaling the outline, and inverting the outline.

* * * * *